United States Patent
Bain

(10) Patent No.: US 7,725,512 B1
(45) Date of Patent: May 25, 2010

(54) APPARATUS AND METHOD FOR PERFORMING MULTIPLE EXCLUSIVE OR OPERATIONS USING MULTIPLICATION CIRCUITRY

(75) Inventor: Peter Bain, Ottawa (CA)

(73) Assignee: Altera Corporation, San Jose, CA (US)

( * ) Notice: Subject to any disclaimer, the term of this patent is extended or adjusted under 35 U.S.C. 154(b) by 1064 days.

(21) Appl. No.: 11/412,694

(22) Filed: Apr. 26, 2006

(51) Int. Cl.
*G06F 7/38* (2006.01)

(52) U.S. Cl. ...................................... 708/200

(58) Field of Classification Search ........................ None
See application file for complete search history.

(56) References Cited

U.S. PATENT DOCUMENTS

| | | | |
|---|---|---|---|
| 5,012,135 A | * | 4/1991 | Kaplinsky ................... 326/45 |
| 5,831,877 A | * | 11/1998 | Thomson .................... 708/200 |
| 6,137,309 A | * | 10/2000 | Couteaux et al. .............. 326/55 |
| 7,170,317 B2 | * | 1/2007 | White .......................... 326/53 |
| 2004/0201411 A1 | * | 10/2004 | White .......................... 327/407 |
| 2007/0174372 A1 | * | 7/2007 | Feghali et al. ............... 708/200 |

OTHER PUBLICATIONS

"Digital Signal Processing Block", Stratix II Device Handbook, vol. 1, Chapter 2, pp. 40-50, Altera Corporation, Dec. 2005.

* cited by examiner

*Primary Examiner*—David H Malzahn
(74) *Attorney, Agent, or Firm*—Weaver Austin Villeneuve & Sampson LLP

(57) ABSTRACT

An apparatus and method for performing multiple exclusive OR (XOR) operations using standard binary multiplication circuitry to create multiple XOR expressions simultaneously. The method and apparatus include a multiplication circuit to generate a product result by performing a multiplication between a multiplier and a multiplicand. A selection circuit is then used to break down the product result into a plurality of partial product sub-expressions. An XOR gate is provided to generate a final expression from one or more of the plurality of partial product sub-expression. The present invention is suited for performing calculations involving a large number of XOR operations with various combinations of product terms, such as cyclical redundancy check calculations.

28 Claims, 3 Drawing Sheets

```
      0 1 0 0 1
   X  0 b 0 0 a
   ─────────────
      0 a 0 0 a
      0 0 0 0 0
      0 0 0 0 0
    0 b 0 0 b
 +  0 0 0 0 0
─────────────────
```

| | | | Partial Product |
|---|---|---|---|
| b | b+a | a | |

↓ bit position: 2 - 0 = a

↓ bit position: 5 - 3 = a + b

↓ bit position: 8 - 6 = b

*FIG. 1*

APPARATUS AND METHOD FOR PERFORMING MULTIPLE EXCLUSIVE OR OPERATIONS USING MULTIPLICATION CIRCUITRY

BACKGROUND

1. Field of the Invention

The present invention generally relates to data communications, and more particularly, to an apparatus and method for performing multiple exclusive OR (XOR) operations using standard binary multiplication circuitry to create multiple XOR expressions simultaneously. The present invention is suited for performing calculations involving a large number of XOR operations with various combinations of product terms, such as cyclic redundancy check calculations.

2. Description of Related Art

Cyclic redundancy check (CRC) is a commonly known technique for determining transmission errors in communication systems. In digital data communication systems, bits of information often need to be transmitted from a transmitting location to a receiving location. Cyclic redundancy checking is a method of checking for errors in the data transmission over the communications link. For example when a block of data is to be transmitted, the sending device performs a calculation using either a 16 or 32 bit generator polynomial on the block to create a cyclic redundancy code (CRC) check. The resulting CRC check is then appended to the transmitted block. At the receiving device, the same calculation using the same polynomial is performed on the data block. If the computed CRC check result is the same as the appended CRC check, it is assumed that the data has been received successfully. If not, the sender can be notified to resend the block of data.

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. The blocks of logic, often referred to by such names as Logic Elements (LEs), Adaptive Logic Modules (ALMs), or Complex Logic Blocks (CLBs), usually include one or more look up table (LUTs), programmable registers, adders and other circuitry to implement various logic and arithmetic functions. Many PLDs also include dedicated blocks of memory of various sizes for a variety of applications. Yet other PLDs include Digital Signal Processing (DSP) blocks for performing multiplication and other signal processing techniques such as finite input response filters or FIR filters. One commercially available PLD with blocks of logic, dedicated memory blocks, and DSP blocks is the Stratix II offered by Altera Corporation, San Jose, Calif. For more details on the Stratix II, see the "Stratix II Architecture", Altera document number SII51002-4.0, Altera Corporation, December 2005, incorporated in its entirety by reference herein for all purposes.

In the aforementioned Stratix II device for example, the DSP blocks have circuitry for implementing multiplication, addition and subtraction. The PLD can be implemented into one of four modes of operation, including: (i) simple multiplier; (ii) multiply-accumulator; (iii) two-multipliers and an adder; and (iv) four-multipliers and an adder. In the modes having a multiplier and an adder, two numbers can be multiplied and then the product can be added/subtracted to a third number by the adder.

PLDs are often used for communication applications. A PLD can be configured as either a transmitter, a receiver, or a transceiver. Regardless if transmitting or receiving bits of information, the PLD will often have to perform a CRC operation to determine the integrity of the transmitted data. With current PLDs, the CRC operation is typically implemented using a large number of LUTs in the logic blocks provided on the device. This arrangement, however, is highly inefficient. The LUTs used for implementing the CRC function could otherwise be used for implementing other logic.

An apparatus and method for performing cyclical redundancy check calculations using the multiplication circuitry provided in the DSP blocks of a PLD is therefore needed.

SUMMARY OF THE INVENTION

An apparatus and method for performing multiple exclusive OR (XOR) operations using standard binary multiplication circuitry to create multiple XOR expressions simultaneously is disclosed. The method includes generating a product result by performing a multiplication between a multiplier and a multiplicand. The product result is then broken down into a plurality of partial product sub-expressions. Selected final expression are generated by performing an XOR operation on one or more of the plurality of partial product sub-expression. The apparatus includes a multiplication circuit to generate a product result by performing a multiplication between a multiplier and a multiplicand. A selection circuit is then used to break down the product result into a plurality of partial product sub-expressions. An XOR gate is provided to generate a final expression from one or more of the plurality of partial product sub-expression. The present invention is suited for performing calculations involving a large number of XOR operations with various combinations of product terms, such as cyclical redundancy check calculations.

BRIEF DESCRIPTION OF THE DRAWINGS

The invention may best be understood by reference to the following description taken in conjunction with the accompanying drawings, which illustrate specific embodiments of the present invention.

FIG. 1 is diagram illustrating the multiplication of the five least significant bits of a multiplier and a multiplicand.

It should be noted that like reference numbers refer to like elements in the figures.

DETAILED DESCRIPTION OF SPECIFIC EMBODIMENTS

Figure 2:
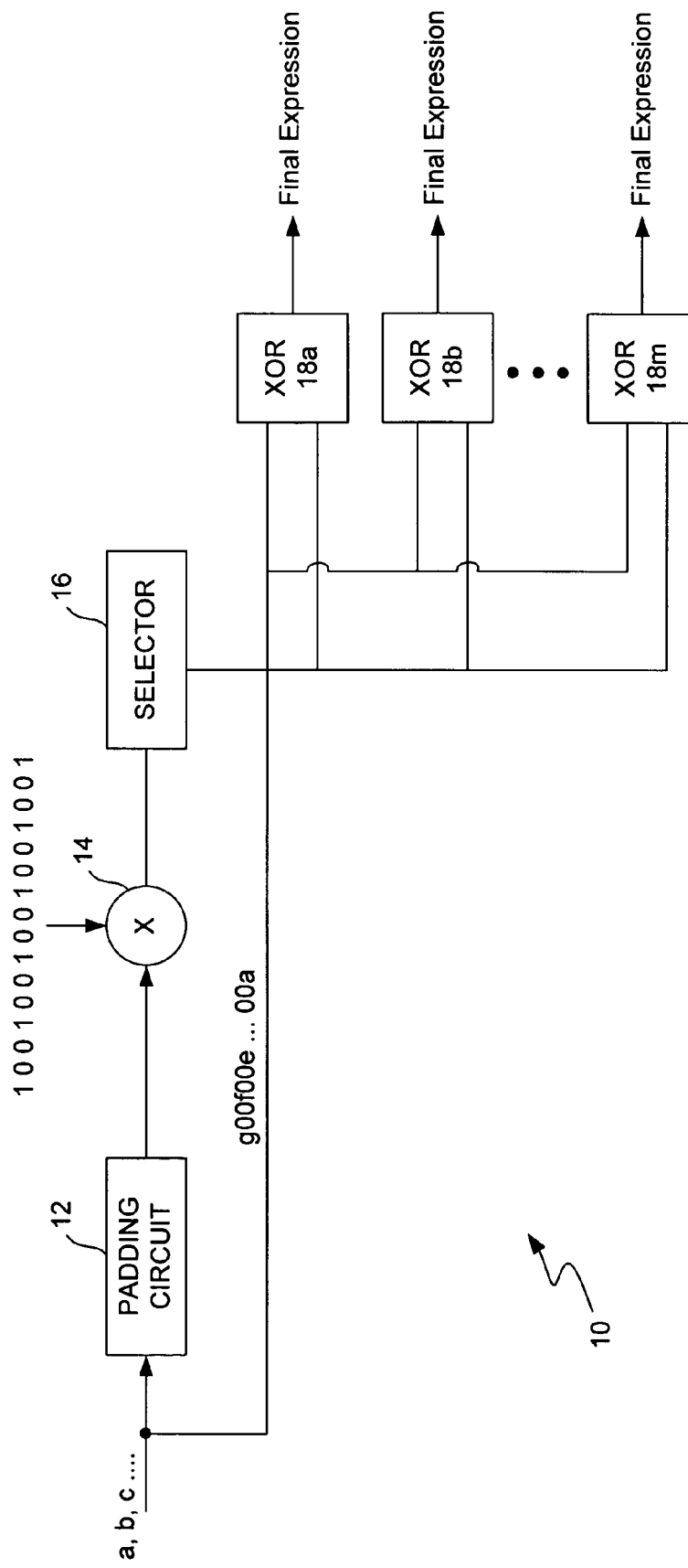
FIG. 2 is a logic diagram illustrating circuitry for implementing the present invention according to one embodiment.

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as those using programmable devices, or application-specific integrated circuit (ASIC) devices, or a combination thereof CRC and similar calculations require the computation of a large number of XOR expressions with various combinations of terms. The present invention relies on a standard binary multiplication circuit to create a number of XOR sub-expressions simultaneously. The sub-expressions are subsequently selectively combined into one or more final expressions.

To explain the overall methodology of the present invention, an example is first described. Consider the following binary multiplier and multiplicand:

multiplier: 1001001001001001001
multiplicand: g00f00e00d00c00b00a where an exclusive OR (XOR) operation is to be performed on the data word (a, b, c, d, e, f, and g).

For the sake of simplicity, FIG. 1 shows the multiplication of the five least significant bits of the above multiplier and multiplicand. The product results of this multiplication, as illustrated in the figure, is broken down into sub-expressions or partial products. In the example shown, the partial products are three bits wide. Thus, the partial product for bits (2-0) is "a", the partial product for bits (5-3) is "b+a", and the partial product for bits (8-6) is "b".

Multiplying the above multiplier and multiplicand in their entirety using the same methodology described above with regard to FIG. 1 results in the partial products provided in Table I below:

TABLE I

| Bit Positions | Partial Product |
|---|---|
| 2-0 | a |
| 5-3 | a + b |
| 8-6 | a + b + c |
| 11-9 | a + b + c + d |
| 14-10 | a + b + c + d + e |
| 17-15 | a + b + c + d + e + f |
| 20-18 | a + b + c + d + e + f + g |
| 23-21 | b + c + d + e + f + g |
| 26-24 | c + d + e + f + g |
| 29-27 | d + e + f + g |
| 32-30 | e + f + g |
| 35-33 | f + g |
| 38-36 | g |

A review of Table I indicates that least significant bit of each partial product is the XOR of the addend bits. Table II below provides a summary of the product term and its corresponding sub-expression for each of the bit positions listed in the table.

TABLE II

| Bit Position | Product Term | Sub-Expressions |
|---|---|---|
| 0 | P0 | a |
| 3 | P1 | b ⊕ a |
| 6 | P2 | c ⊕ b ⊕ a |
| 9 | P3 | d ⊕ c ⊕ b ⊕ a |
| 10 | P4 | e⊕d ⊕ c ⊕ b ⊕ a |
| 15 | p5 | f ⊕ e⊕d ⊕ c ⊕ b ⊕ a |
| 18 | P6 | g ⊕ f ⊕ e ⊕ d⊕c ⊕ b ⊕ a |
| 21 | P7 | g ⊕ f ⊕ e ⊕ d ⊕ c ⊕ b |
| 24 | P8 | g ⊕ f ⊕ e ⊕ d⊕c |
| 27 | P9 | g ⊕ f ⊕ e ⊕ d |
| 30 | P10 | g ⊕ f ⊕ e |
| 33 | P11 | g ⊕ f |
| 36 | P12 | g |

The values of the product terms provided in Table II and the original variables (i.e., a, b, c, d, e, f, and g) can be selectively used to arbitrarily generate different final expressions. Final expressions are selected product terms or original variables upon which the XOR operation is performed. For example, if an XOR operation is to be performed on the partial product P4 and the variable "c", then the following final expression is obtained.

$$P4 \oplus c = e \oplus d \oplus c \oplus b \oplus a \oplus c = e \oplus d \oplus b \oplus a$$

In another example, the XORing of two sub-expressions P2 and P8 results in a final expression of:

$$P2 \oplus P8 = c \oplus b \oplus a \oplus g \oplus f \oplus e \oplus d \oplus c = g \oplus f \oplus e \oplus d \oplus b \oplus a$$

In both examples, the value "c" drops out of the final result since it is included in both operands respectively.

Referring to FIG. 2, a logic diagram for implementing the present invention as described above is shown. The logic diagram 10 includes a padding circuit 12, a multiplier circuit 14, a selector 16, and a plurality of XOR gates 18a-18m. The padding circuit is configured to receive a message consisting of the plurality of bits (a, b, c, d, e, f, g.). As the bits of the message are received at the padding circuit 12, they are padded by inserting a predetermined number of zeros between each bit. The number of zeros is determined by the formula $(2^{m+1} > n)$ where n equals the number of bits in the data word and m equals the number of zeros inserted between each data bit in the data word. In the above example, two zeros are padded between each of the bits (a, b, c, d, e, f, g), resulting in the multiplicand (g00f00e00d00c00b00a). The multiplier circuit 14 is configured to multiply the multiplicand and the multiplier (1001001001001001001). The results of the multiplier circuit 14 are provided to the selector 16. The selector selects every m+1 bit to generate the sub-expressions for the partial product terms P1 through P12 as listed in Table II. The sub-expressions for each product term P1-P12 and the bits (a, b, c, d, e, f, g.) of the original message are provided to the inputs of each XOR gate 18a-18m respectively. Each of the XOR gates 18a-18m is capable of selecting either: (i) two sub-expressions of different P terms; or (ii) a P term and one of the orginal bits (a, b, c, d, e, f, g.). Each gate 18a-18m performs an XOR operation on the selected inputs to generate a desired final expression.

In one embodiment, the circuit 10 is implemented in a PLD such as the Stratix II device from Altera, the assignee of the present invention. In such an embodiment, the multiplier 14 is implemented in a DSP block of the PLD. The XOR gates 18a-18m are implemented in LUTs. The padding circuit 12 and the select circuit 16 are implemented in the programmable interconnect. It should be noted that it is not necessary to use the Stratix II PLD, and that any PLD having a DSP block, LUTs, and a programmable interconnect could be used.

With certain implementations of the present invention, the size of the partial product terms may carry from one partial product to another. For example, assume the following multiplication in an 18×18 multiplier:

multiplier: 000000010101010101
multiplicand: 0i0h0g0f0e0d0c0b0a

In this example, the fourth through eleventh partial products (pp3-pp10) contain four terms (have weight 4) or more. In each instance, a carry over from one partial product into the next partial product could corrupt the result. The specific sub-expressions for the potentially corrupted partial products are provided in Table III.

TABLE III

| Partial Product | Sub-expression |
|---|---|
| 3 | a + b + c + d |
| 4 | a + b + c + d + e |
| 5 | a + b + c + d + e + f |
| 6 | b + c + d + e + f + g |
| 7 | c + d + e + f + g + h |
| 8 | d + e + f + g + h + i |
| 9 | e + f + g + h + i |
| 10 | f + g + h + i |

Figure 3:
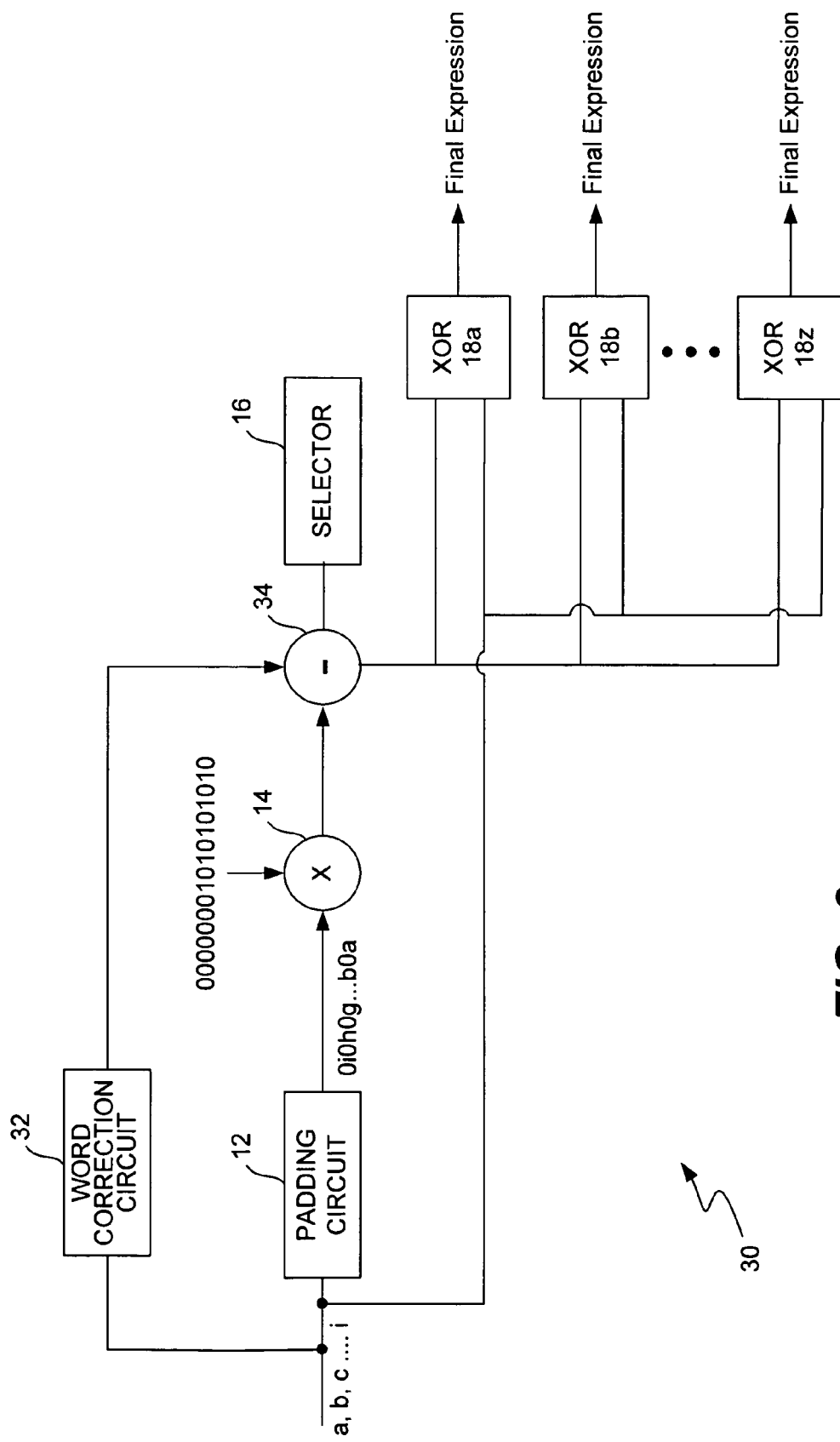
FIG. 3 is another logic diagram illustrating circuitry for implementing the present invention according to another embodiment.

The aforementioned carry problem can be resolved taking advantage of the adder/subtraction circuit provided in most DSP blocks used in current PLDs. After the multiplication between the multiplier and multiplicand is performed, a correction word is subtracted from the product to negate the effect of the carry. Using the same example, the multiplier and the multiplicand:

multiplier: 000000010101010101
multiplicand: 0i0h0g0f0e0d0c0b0a
correction word -MMMMMMMMMMMMMMMMMM Referring to FIG. 3, a logic diagram for implementing the above described embodiment to correct or compensate for the carry problem is shown. The logic diagram 30 includes a padding circuit 12, a multiplier circuit 14, a selector 16, and a plurality of XOR gates 18a-18z. Since the elements with the same reference numbers perform the same function as described above, they are not described in detail herein. The logic diagram further includes a word correction circuit 32 and a subtraction circuit 34. The word correction circuit 50 generates the correction word as described below. The subtraction circuit 34 subtracts the correction word from the product terms to cancel the carries between the partial products.

For the weight-4 partial product, we subtract one of the terms from the partial product. For example, by making M6 (bit 6 of the correction word, bit 0 of pp3) equal b, the corrected partial product cp3=a+b+c+d−b=a+c+d. Since the "b" terms cancel each other out, there will be no carry overflow.

For weight-5 partial products, terms K1(b,c,d,e) and K2(e, f,g,h) are computed, where:

$K(w,x,y,z)=2$ IFF $w+x+y+z>1$, otherwise $K=0$

If a weight-5 partial product containing w,x,y,z is 4 or greater, at least 2 of w,x,y,z equal 1 and K=2. Simliarly, if K=2, at least 2 of the terms equal 1. Therefore, K may be safely subtracted from the partial product without causing a borrow from the next partial product. This subtracts 2 from the PP IFF the PP>=4, canceling the carry, if any. However, the subtraction does not affect the partial product's bit 0, which contains the desired XOR value. The cp4 bit 0 is therefore $e \oplus d \oplus c \oplus b \oplus a$.

For weight 6 products, we use a combination of the above mechanism: subtract a K term and one of the input terms not used in K. Since the input term is 0 or 1 and K is 2 or 0, the subtracted term is merely their concatenation. In the case of pp5, we subtract K1 and a, such that bit 0 of cp5 is $f \oplus e \oplus d \oplus c \oplus b$.

Furthermore, we can increase the weight of very-low weight terms. Consider product terms (pp0-2) which are a, a+b, and a+b+c respectively. Placing these partial products together, we have $$\{pp2, pp1, pp0\}=16(a+b+c)+4(a+b)+a$$

If we subtract 11c, i.e. put c in positions 0, 1, and 3, the result is 5c. Therefore:

$$\{cp2, cp1, cp0\}=16(a+b)+4(a+b+c)+(a+c)$$

Finally, consider the example of:

$$\{pp13, pp12\}=4(i)+(h+i)$$

Subtracting 3a+4b from the above results in the following $$\{cp13, cp12\}=4(a-b+i)+(h+i-a).$$

Bit 0 of cp13 and cp12=$a \oplus b \oplus i$ and $h \oplus i \oplus a$ respectively.

Using all these methods, we get the following XORs:

$a \oplus c$ $a \oplus b \oplus c$ $a \oplus b$ $a \oplus c \oplus d$ $b \oplus c \oplus d \oplus e$ or $b \oplus c \oplus d \oplus e \oplus f$ $b \oplus c \oplus d \oplus e \oplus f$ or $a \oplus b \oplus c \oplus d \oplus e$ $b \oplus c \oplus d \oplus e \oplus f$ or $b \oplus c \oplus d \oplus e \oplus g$ $d \oplus e \oplus f \oplus g \oplus h$ or $c \oplus e \oplus f \oplus g \oplus h$ $d \oplus e \oplus f \oplus g \oplus h$ or $e \oplus f \oplus g \oplus h \oplus i$ $e \oplus f \oplus g \oplus h \oplus i$ or $e \oplus f \oplus g \oplus h$ $f \oplus g \oplus h$ or $f \oplus h \oplus i$ or $f \oplus g \oplus i$ or $g \oplus h \oplus i$ $g \oplus h \oplus i$ $a \oplus h \oplus i$ $a \oplus b \oplus i$ Thus, in summary, low weight product terms can be added to either (i) other low weight product terms to realize higher weight product terms; or (ii) low weight product terms and one or more of the received message bits a, b, c . . . etc.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A method, comprising:
    generating a product result using a multiplication circuit by performing a multiplication between a multiplier and a multiplicand;
    breaking down the product result of the multiplication into a plurality of partial product sub-expressions; and
    generating a selected final expression by performing an XOR operation on one or more of the plurality of partial product sub-expression.

2. The method of claim 1, wherein the generating the selected final expression further comprises:
    selecting a first partial product sub-expression among the plurality of partial product sub-expressions;
    selecting a second partial product sub-expression among the plurality of partial product sub-expressions; and
    performing the XOR operation on the selected first partial product sub-expression and the selected second partial product sub-expression.

3. The method of claim 1, wherein the breaking down the product result of the multiplication into the plurality of partial product sub-expressions further comprises breaking down the partial product sub-expressions into a predetermined number of bits.

4. The method of claim 3, wherein the predetermined number of bits wide ranges from two bits wide to sixteen bits wide.

5. The method of claim 1, wherein the multiplicand comprises a series of bits received in a message.

6. The method of claim 5, wherein the generating the final expression further comprises:
    selecting a first partial product sub-expression among the plurality of partial product sub-expressions;
    selecting one of the bits of the multiplicand received in the message; and
    performing an XOR operation on the selected first partial product sub-expression and the selected bit of the multiplicand received in the message.

7. The method of claim 5, wherein the message is a data word.

8. The method of claim 5, further comprising generating a correction word from the series of bits received in the message.

9. The method of claim 8, further comprising subtracting the correction word from the product result for the purpose of canceling any carries between partial product sub-expressions.

10. The method of claim 5, wherein the series of bits of the multiplicand are padded with a predetermined number of zeros before being multiplied by the multiplier.

11. The method of claim 10, wherein the number of zeros used to pad the multiplicand is predetermined by the formula $(2^{m+1}>n)$ where n equals the number of bits in the message and m equals number of zeros inserted between the bits of the message.

12. The method of claim 11, wherein the breaking down the product result of the multiplication into the plurality of partial product sub-expressions further comprises selecting every m+1 bit from the result of the multiplication.

13. An apparatus, comprising:
    a multiplication circuit to generate a product result by performing a multiplication between a multiplier and a multiplicand;
    a selection circuit to break down the product result of the multiplication into a plurality of partial product sub-expressions; and
    an XOR gate to generate a final expression from one or more of the plurality of partial product sub-expression.

14. The apparatus of claim 13, wherein the selection circuit breaks down the product result of the multiplication into a plurality of partial product sub-expressions of a predetermined number of bits wide.

15. The apparatus of claim 14, wherein the predetermined number of bits wide ranges from two bits wide to sixteen bits wide.

16. The apparatus of claim 13, wherein the XOR gate to generate the final expression further comprises a LUT configured to receive the plurality partial product sub-expressions at its inputs respectively, the LUT being configured to perform a XOR operation on a first selected partial product sub-expression and a second selected partial product sub-expression.

17. The apparatus of claim 13, wherein a multiplier is implemented in a digital signal processing block on a programmable logic device.

18. The apparatus of claim 13, where the XOR gate is implemented in a LUT on a programmable logic device.

19. The apparatus of claim 13, wherein the selection circuit is implemented in programmable interconnect provided on a programmable logic device.

20. The apparatus of claim 13, wherein the multiplicand comprises a series of bits received in a message.

21. The apparatus of claim 20, wherein the XOR gate to generate the final expression further comprises a LUT configured to receive the plurality partial product sub-expressions and the bits of the multiplicand at its inputs respectively, the LUT table performing a XOR operation on a first selected first partial product sub-expression and a selected bit of the multiplicand.

22. The apparatus of claim 20, wherein the message is a data word.

23. The apparatus of claim 20, further comprising a correction word generator to generate a correction word from the series of bits received in the message.

24. The apparatus of claim 23, further comprising a subtraction circuit configured to subtract the correction word from the product result for the purpose of canceling any carries between partial product sub-expressions.

25. The apparatus of claim 20, further comprising a padding circuit to pad the series of bits of the multiplicand with a predetermined number of zeros between each of the series of bits before being multiplied by the multiplier.

26. The apparatus of claim 25, wherein the padding circuit is implemented in programmable interconnect provided on a programmable logic device.

27. The apparatus of claim 25, wherein the number of zeros used to pad the multiplicand is predetermined by the formula $(2^{m+1}>n)$ where n equals the number of bits in the message and m equals the number of zeros inserted between the bits of the message.

28. The apparatus of claim 27, wherein the selection circuit is configured to break down the result of the multiplication into the plurality of partial product sub-expressions by selecting every m+1 bit from the product result of the multiplication.

* * * * *